(12) United States Patent
Atsatt

(10) Patent No.: US 11,296,705 B2
(45) Date of Patent: *Apr. 5, 2022

(54) STACKED PROGRAMMABLE INTEGRATED CIRCUITRY WITH SMART MEMORY

(71) Applicant: Intel Corporation, Santa Clara, CA (US)

(72) Inventor: Sean Atsatt, Santa Cruz, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/924,044

(22) Filed: Jul. 8, 2020

(65) Prior Publication Data

US 2021/0058086 A1 Feb. 25, 2021

Related U.S. Application Data

(63) Continuation of application No. 16/545,381, filed on Aug. 20, 2019, now Pat. No. 10,749,528.

(51) Int. Cl.
*H03K 19/17736* (2020.01)
*H01L 25/18* (2006.01)
(Continued)

(52) U.S. Cl.
CPC ....... *H03K 19/17736* (2013.01); *G11C 15/00* (2013.01); *H01L 25/18* (2013.01);
(Continued)

(58) Field of Classification Search
CPC ......... H03K 19/17736; H03K 19/1776; H03K 19/1737; H03K 19/17756;
(Continued)

(56) References Cited

U.S. PATENT DOCUMENTS 5,457,410 A 10/1995 Ting
5,787,007 A 7/1998 Bauer
(Continued)

OTHER PUBLICATIONS

Coudrain et al., Active interposer technology for chiplet-based advanced 3D system architectures, 2019 IEEE 69th Electronic Components andTechnology Conference (ECTC), IEEE, May 28, 2019-May 31, 2019, pp. 569-578, Las Vegas, Nevada, United States.

(Continued)

*Primary Examiner* — Don P Le
(74) *Attorney, Agent, or Firm* — Fletcher Yoder, P.C.

(57) ABSTRACT

Circuitry is provided that includes programmable fabric with fine-grain routing wires and a separate programmable coarse-grain routing network that provides enhanced bandwidth, low latency, and deterministic routing behavior. The programmable fabric may be implemented on a top die that is stacked on the active interposer die. The programmable coarse-grain routing network and smart memory circuitry may be implemented on an active interposer die. the smart memory circuitry may be configured to perform higher level functions than simple read and write operations. The smart memory circuitry may carry out command based low cycle count operations using a state machine without requiring execution of a program code, complex microcontroller based multicycle operations, and other non-generic microcontroller based smart RAM functions.

20 Claims, 13 Drawing Sheets

(51) Int. Cl.
*H03K 19/1776* (2020.01)
*H03K 19/173* (2006.01)
*H03K 19/17756* (2020.01)
*G11C 15/00* (2006.01)
*H03K 19/17728* (2020.01)

(52) U.S. Cl.
CPC ..... *H03K 19/1737* (2013.01); *H03K 19/1776* (2013.01); *H03K 19/17728* (2013.01); *H03K 19/17756* (2013.01)

(58) Field of Classification Search
CPC .............. H03K 19/17728; H01L 25/18; H01L 2924/00014; H01L 2224/16145; H01L 2225/06513; H01L 2225/06517; H01L 24/16; H01L 25/105; G11C 15/00; G11C 5/04; G11C 15/04; H04L 45/06
USPC ......................................................... 326/41
See application file for complete search history.

(56) References Cited

U.S. PATENT DOCUMENTS

| | | | |
|---|---|---|---|
| 6,072,233 A | 6/2000 | Corisis et al. | |
| 6,461,895 B1 | 10/2002 | Liang et al. | |
| 6,604,230 B1 | 8/2003 | Khalid et al. | |
| 6,803,787 B1* | 10/2004 | Wicker, Jr. | G06F 9/321 |
| | | | 326/38 |
| 6,842,034 B1 | 1/2005 | Chan et al. | |
| 6,891,397 B1 | 5/2005 | Brebner | |
| 7,408,381 B1* | 8/2008 | Drimer | G06F 30/34 |
| | | | 326/41 |
| 7,536,669 B1 | 5/2009 | Anderson | |
| 7,619,441 B1 | 11/2009 | Rahman et al. | |
| 8,159,973 B2 | 4/2012 | Deng et al. | |
| 8,201,129 B2 | 6/2012 | Lee et al. | |
| 8,214,902 B2* | 7/2012 | Khosravi | G06F 21/565 |
| | | | 726/24 |
| 8,542,032 B1 | 9/2013 | Hutton et al. | |
| 8,860,460 B1 | 10/2014 | Cashman | |
| 8,922,243 B2 | 12/2014 | Jayasena et al. | |
| 9,099,999 B1 | 8/2015 | Wang et al. | |
| 9,106,229 B1 | 8/2015 | Hutton et al. | |
| 9,129,935 B1 | 9/2015 | Chandrasekar et al. | |
| 9,294,092 B2 | 3/2016 | Hutton | |
| 9,344,091 B2 | 5/2016 | Jayesena et al. | |
| 9,633,872 B2 | 4/2017 | Chen et al. | |
| 9,847,783 B1 | 12/2017 | Teh et al. | |
| 9,935,052 B1 | 4/2018 | Liu et al. | |
| 10,587,270 B2 | 3/2020 | Wallichs et al. | |
| 10,601,426 B1 | 3/2020 | Subbareddy et al. | |
| 2006/0119384 A1 | 6/2006 | Camarota et al. | |
| 2013/0154685 A1* | 6/2013 | Noyes | G06F 9/4498 |
| | | | 326/38 |
| 2013/0181257 A1 | 7/2013 | Ngai | |
| 2014/0181458 A1 | 6/2014 | Loh et al. | |
| 2016/0026742 A1 | 1/2016 | Schelle et al. | |
| 2016/0126291 A1 | 5/2016 | Lu et al. | |
| 2017/0161420 A1 | 6/2017 | Hou et al. | |
| 2017/0310756 A1 | 10/2017 | Pandya | |
| 2018/0176006 A1 | 6/2018 | McElheny et al. | |
| 2019/0044515 A1 | 2/2019 | Gutala et al. | |
| 2019/0214991 A1 | 7/2019 | Ngai | |

OTHER PUBLICATIONS

Subbaredy et al., U.S. Appl. No. 16/123,765, filed Sep. 6, 2018.
Wallichs et al., U.S. Appl. No. 16/439,577, filed Jun. 12, 2019.

* cited by examiner

STACKED PROGRAMMABLE INTEGRATED CIRCUITRY WITH SMART MEMORY

This application is a continuation of U.S. patent application Ser. No. 16/545,381, filed Aug. 20, 2019, which is hereby incorporated by reference herein in its entirety.

BACKGROUND

This relates generally to integrated circuits and more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is then loaded into memory elements on a programmable integrated circuit device to configure that device to perform the functions of the custom logic circuit. Such types of programmable integrated circuits are sometimes referred to as a field-programmable gate array (FPGA).

A multichip integrated circuit package often includes an FPGA die mounted on top of an active interposer. The active interposer may contain memory. The bandwidth and latency of the interface connecting the FGPA die to the interposer memory are limited by the number of available connections between the FPGA die and the active interposer. The existing interposer memory has a limited use model and can only support a small range of applications.

It is within this context that the embodiments described herein arise.

DETAILED DESCRIPTION

The present embodiments relate to programmable integrated circuits, and in particular, to a programmable integrated circuit (e.g., a field-programmable gate array) stacked on an active interposer that contains a distributed smart memory array. The term "smart" refers a memory's ability to perform higher level functions than simple read and write operations and to perform a sequence of operations not typically supported by a generic microcontroller.

The smart memory may utilize a built-in state machine to perform higher level low-cycle-count operations (e.g., updates in memory, comparisons in memory, simple linked list traversals, content addressable memory operations, cache operations, etc.) or may act like a microcontroller to perform complex multicycle data movement patterns and operations (e.g., complex data arrangement operations, complex linked list traversals, direct media access controller operations, FPGA logic controller operations, etc.) and other smart memory functions not typically optimized for in a generic microcontroller. A state machine may be faster and more specific than a microcontroller, whereas the microcontroller is relatively slower and more generalized. The smart memory allows the IC package to keep operations within the active interposer for as long as possible without having to cross over to the FPGA die, which further increases computer performance while consuming less power.

The distributed smart memory array may be interconnected using a configurable coarse-grain routing network that provides deterministic pre-wired routing interconnects offering guaranteed timing closure and register pipelines at fixed locations to satisfy a target maximum operating frequency in a wide range of computing applications. Use of a distributed smart memory array and a programmable coarse-grain routing network within an active interposer provides a tangible improvement to computer technology by providing a more flexible and efficient utilization of the interposer memory, by enabling the smart memory to support a wide variety of complex use cases via an evolvable intellectual property (IP) library model, and by increasing the effective memory bandwidth by a factor of 2-4×.

It will be recognized by one skilled in the art, that the present exemplary embodiments may be practiced without some or all of these specific details. In other instances, well-known operations have not been described in detail in order not to unnecessarily obscure the present embodiments.

Figure 1:
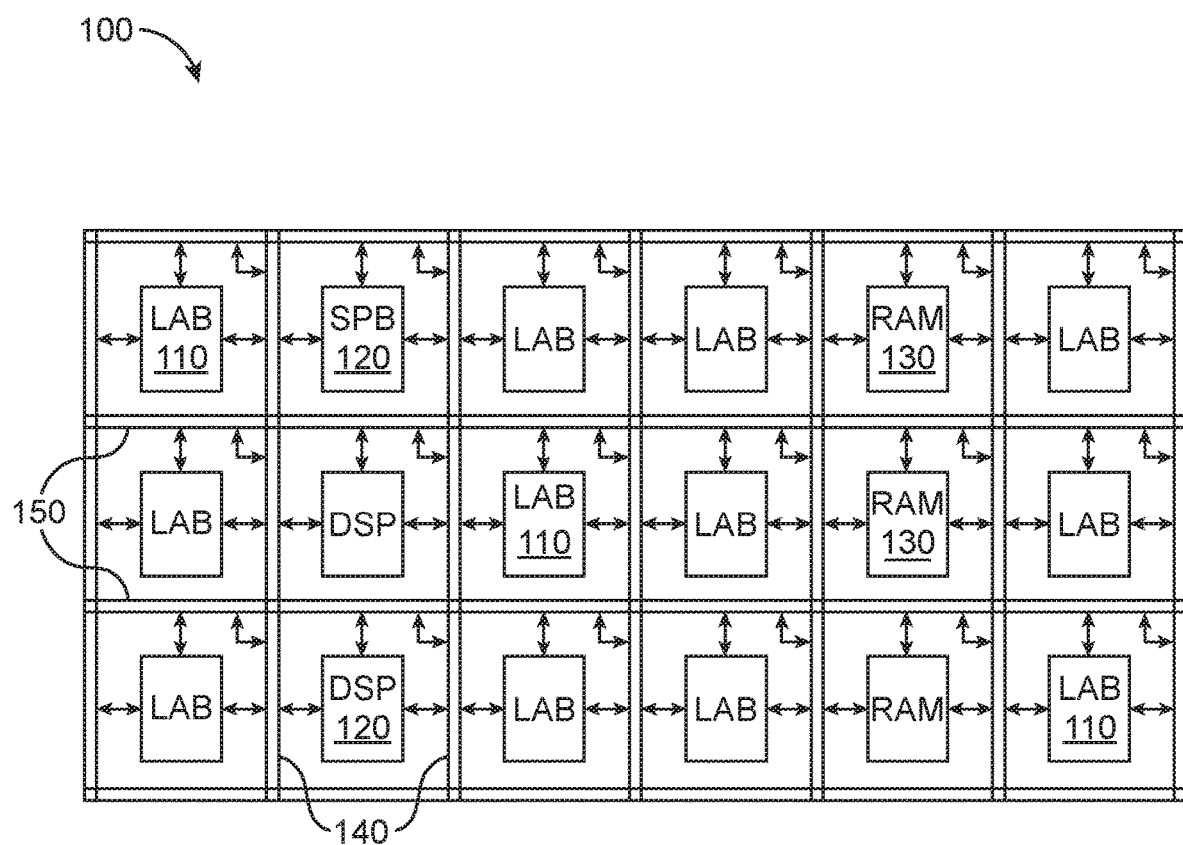
FIG. 1 is a diagram of illustrative programmable integrated circuitry in accordance with an embodiment.

An illustrative embodiment of programmable integrated circuitry 100 such as a programmable logic device (PLD) or a field-programmable gate array (FPGA) that may be configured to implement a circuit design is shown in FIG. 1. As shown in FIG. 1, circuitry 100 may include a two-dimensional array of functional blocks, including logic array blocks (LABs) 110 and other functional blocks such as random access memory (RAM) blocks 130 and digital signal processing (DSP) blocks 120, for example.

Functional blocks such as LABs 110 may include smaller programmable regions (e.g., logic elements, configurable logic blocks, or adaptive logic modules) that receive input signals and perform custom functions on the input signals to produce output signals. LABs 110 may also be grouped into larger programmable regions sometimes referred to as logic sectors that are individually managed and configured by corresponding logic sector managers. The grouping of the programmable logic resources on device 100 into logic sectors, logic array blocks, logic elements, or adaptive logic modules is merely illustrative. In general, circuitry 100 may include functional logic blocks of any suitable size and type, which may be organized in accordance with any suitable logic resource hierarchy.

Circuitry 100 may contain programmable memory elements. These memory elements may be loaded with configuration data (also called programming data). Once loaded, the memory elements each provide a corresponding static control signal that controls the operation of an associated functional block (e.g., LABs 110, DSP 120, RAM 130, etc.). In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration random-access memory (CRAM), or programmable memory elements. Circuitry 100 may be configured to implement a custom circuit design. For example, the configuration RAM may be programmed such that LABs 110, DSP 120, and RAM 130, and programmable interconnect circuitry (i.e., vertical channels 140 and horizontal channels 150) form the circuit design implementation.

In addition, the programmable logic device may further include input-output (I/O) elements (not shown) for driving signals off of circuitry 100 and for receiving signals from other devices. The input-output elements may include parallel input-output circuitry, serial data transceiver circuitry, differential receiver and transmitter circuitry, or other circuitry used to connect one integrated circuit device to another.

As described above, circuitry 100 may also include programmable interconnect circuitry in the form of vertical routing channels 140 and horizontal routing channels 150, each routing channel including at least one track to route at least one or more wires. If desired, the interconnect circuitry may include pipeline elements, and the contents stored in these pipeline elements may be accessed during operation.

Note that other routing topologies, besides the topology of the interconnect circuitry depicted in FIG. 1, are intended to be included within the scope of the present invention. For example, the routing topology may include wires that travel diagonally or that travel horizontally and vertically along different parts as well as wires that are perpendicular to the device plane in the case of three dimensional integrated circuits, and the driver of a wire may be located at a different point than one end of a wire. The routing topology may include global wires that span substantially all of circuitry 100, fractional global wires such as wires that span part of circuitry 100, staggered wires of a particular length, smaller local wires, or any other suitable interconnection resource arrangement.

As described above in connection with FIG. 1, circuitry 100 may implement a programmable integrated circuit such as a field programmable gate array (FPGA). Configurations in which an FPGA is coupled to a distributed smart memory array via a dedicated programmable coarse-grain routing network may sometimes be described herein as an example. This is, however, merely illustrative. In general, the structures, methods, and techniques described herein may be extended to other suitable types of integrated circuits.

The horizontal routing wires 140 and vertical routing wires 150 that are used to interconnect the various functional blocks within an FPGA are sometimes referred to as "fine-grain" routing wires. Fine-grain routing wires are programmable with bit-level granularity. As the speed of external input-output interface protocols continues to double every two to three years, the performance improvement of fine-grain FPGA routing interconnect is, however, limited due to semiconductor parasitics (i.e., parasitic capacitance and resistance) and metal width and spacing requirements, all of which limits maximum frequency (Fmax) gains. Also, since the fine-grain routing is used to distribute both local and global wires, packing large related bus networks together will reduce the number of routing wires available for traditional FPGA logic inter-logic-element connectivity.

FPGAs may also be provided with dedicated fixed-function network on chip (NoC) fabric, which can offer higher bandwidth capacity but imposed additional overhead and tradeoffs. For instance, NoC fabric interconnects include additional overhead required for implementing credit throttling, backpressure, and bridging required of NoC-based protocols such as the AXI NoC interface protocol. Other problems associated with NoC-based fabric are that its routing may be nondeterministic and that the bandwidth allocation is inflexible and complex.

As integrated circuit technology scales towards smaller device dimensions, device performance continues to improve at the expense of increased power consumption. In an effort to reduce power consumption, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another (sometimes referred to as 3-dimension or "3D die stacking").

Figure 2:
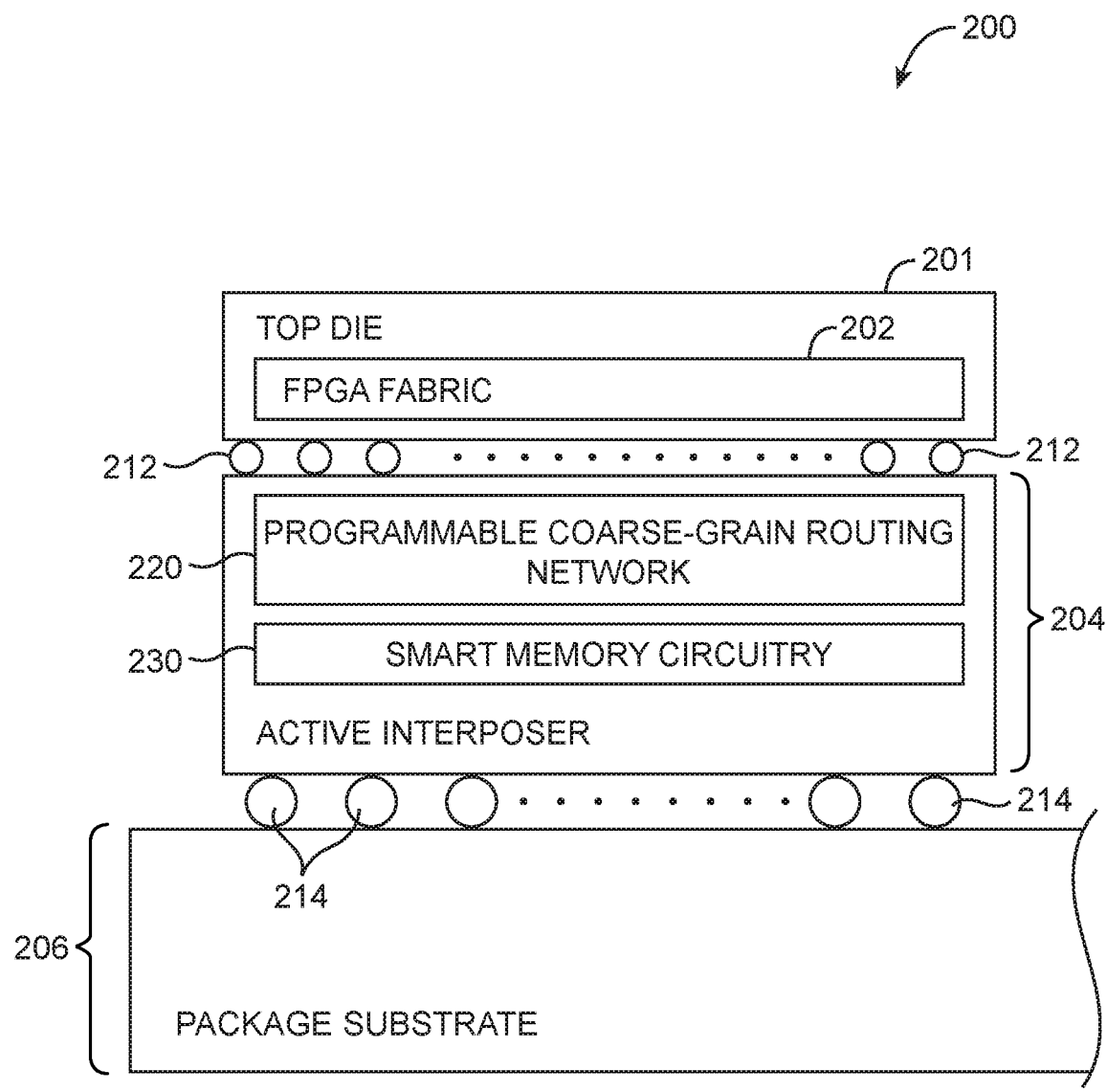
FIG. 2 is a cross-sectional side view of an illustrative 3-dimensional (3D) stacked multichip package in accordance with an embodiment.

Technologies such as 3D stacking have enabled a new dimension for building heterogeneous products by utilizing one of the stacked dies to expand memory capacity, compute power, and also interconnect capacity to help FPGAs keep pace and scale with external IO interface protocols. FIG. 2 shows a cross-sectional side view of an illustrative multichip package 200 that includes a package substrate 206, an active interposer die 204 mounted on package substrate 206, and an integrated circuit (IC) die 201 mounted on top of active interposer 204. As shown in FIG. 2, the FPGA fabric 202 (which can include programmable logic 110, DSP blocks 120, RAM blocks 130, and associated CRAM cells) may be formed within the top IC die 201.

Microbumps 212 may be formed between dies 201 and 204 to help couple the circuitry on die 201 to the circuitry on die 204. Bumps such as controlled collapse chip connection (C4) bumps 214 (sometimes referred to as flip-chip bumps) may be formed at the bottom surface of interposer 204. Generally, C4 bumps 214 (e.g., bumps used for interfacing with off-package components) are substantially larger in size compared to microbumps 212 (e.g., bumps used for interfacing with other dies within the same multichip package). The number of microbumps 212 is also generally much greater than the number of flip-chip bumps 214 (e.g., the ratio of the number of microbumps to the number of C4 bumps may be greater than 2:1, 5:1, 10:1, etc.).

In particular, active interposer 204 may include an embedded coarse-grain routing network such as programmable coarse-grain routing network 220 and smart memory circuitry 230. Programmable coarse-grain routing network 220 can be used to address the needs of programmable IC designs that require the use of deterministic global routing interconnects and/or NoC-type fabric networks. The fine-grain routing wires that traditionally implement local and global routing within the FPGA fabric 202 have variable routing lengths and pipelining locations that are programmable (i.e., the fine-grain routing wires have lengths and pipelining locations that are not fixed). A design compiler tool for compiling an FPGA design must attempt to meet a target Fmax requirement with no guarantees. Shorter fine-grain wires are cascaded together to form longer wires and must arrive at a reasonably close register to meet timing requirements. Moreover, multi-bit buses in a fine-grain routing configuration may all take different routing paths before arriving at the same final destination. The various paths that can be taken could also change from one design compilation to another. In other words, fine-grain routing lacks frequency determinism. This is because fine-grain routing is not pre-defined in how it is routed and thus the compiler has many degrees of freedom. This results in more flexibility but less clock frequency predictability at which a path is executed. In contrast, multi-bit buses in the coarse-grain routing network 220 exhibits relatively greater frequency determinism in the sense that the coarse-grain routing channels and the smart RAM blocks are all designs to run at a specific frequency and may all take the same routing path on the interposer die.

In contrast to fine-grain routing wires, programmable coarse-grain routing network 220 is programmable with byte-level, word-level, or other multibit-wide granularity and has pipelines at fixed locations to satisfy a target operating frequency. The coarse-grain routing network 220 may also exhibit transport delay determinism, which allows network 220 to know where the data is on each clock cycle at least at the transport endpoints (such as at the smart RAM blocks or the FPGA logic). In other words, network 22 will be able to determine at which clock cycle an event will occur with certainty. Transport delay determinism is advantageous because it allows each component in the system to optimize for throughput. The 8-bit granularity provides the least common coarse-grain width, which is capable of supporting the needs of different computes variables (8/16/32/64 bits) as well as the most commonly used memory and IO data path widths. Interconnects within the coarse-grain routing network 220 are pre-wired to ensure timing closure (e.g., the routing channels within network 220 are guaranteed in terms of timing and inter-bus skew).

By forming the coarse-grain network 220 as a separate component from the top FPGA die 201, any global or longer-reach routing paths spanning a larger number of logic regions (e.g., spanning five or more logic array blocks) can be passed down to routing network 220 and then back up to an appropriate remote destination on top die 201. Dedicating coarse-grain routing network 220 to perform global routing allows the fine-grain routing wires on the top die 201 to only focus on handling local or short-reach routing paths. Offloading deterministic, pipelined, coarse-grain routing to the active interposer 204 in this way provides an improvement to integrated circuit performance by enabling more efficient high-bandwidth data movement (since the coarse-grain routing network is designed and optimized to run at the maximum operating frequency fmax) within the FPGA circuitry and also on and off the FPGA, by allowing late binding decisions for FGPA use cases while not precluding higher level protocol overlays such as a network on chip, by permitting efficient sharing of wires for different independent traffic flows, by allowing flexible scalability to achieve the desired parallelism and bandwidth, and by providing deterministic data streaming between endpoints using a fixed pre-wired pipelined channel structure.

The example of FIG. 3 in which programmable coarse-grain routing network 220 is formed on a separate 3D stacked die relative to FPGA die 201 is merely illustrative. If desired, coarse-grain routing network 220 could be formed in different regions as fabric 202 on the same die, could be overlaid on top of fabric 202 in different metal routing layers of the same die, may be formed on separate 2D laterally mounted dies, may be formed as part of different IC packages, etc. If desired, one or more transceiver dies, high bandwidth memory dies, and other suitable components may be optionally mounted on active interposer 204 or on package substrate 206 within the multichip package 200.

Figure 3A:
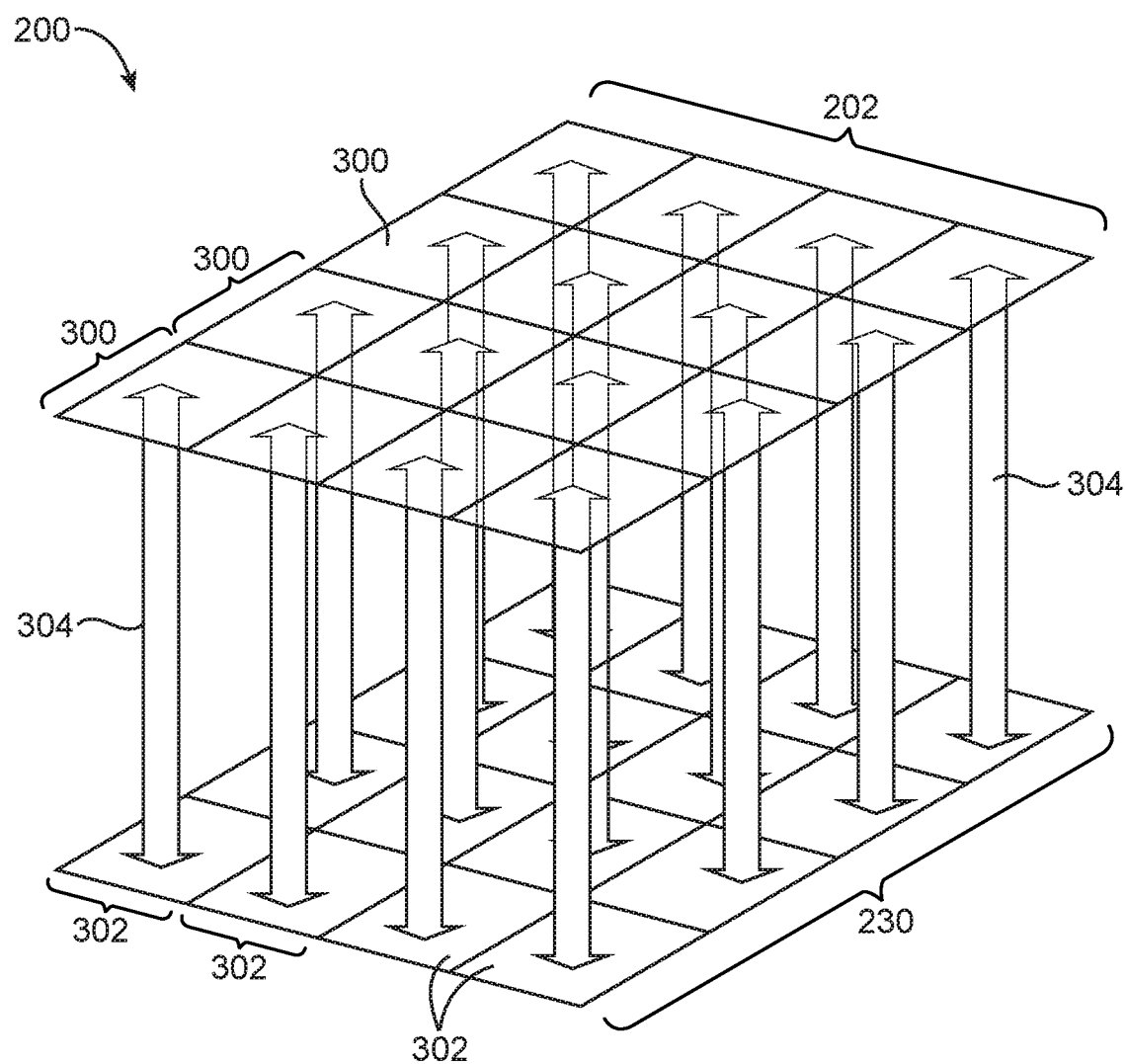
FIG. 3A is a perspective view illustrating an array of logic fabric sectors mounted over an array of smart memory sectors in accordance with an embodiment.

In accordance with an embodiment, programmable coarse-grain routing network 220 is coupled to smart memory circuitry 230 within the active interposer 204 (e.g., smart memory circuitry 230 may communicate with FPGA fabric 202 via coarse-grain routing network 220 and microbumps 212). Arranged as such, the FPGA fabric 202 may be formed above the smart memory circuitry 230. FIG. 3A is a perspective view illustrating an array of logic fabric sectors mounted over an array of smart memory sectors. As shown in FIG. 3A, FPGA logic fabric 202 may include an array of logic fabric sectors 300, whereas the smart memory circuitry 230 may include an array of smart memory sectors 302. Each logic sector 300 may be coupled to and communicate with a corresponding smart memory sector 302 below, as indicated by communications paths 304.

Figure 3B:
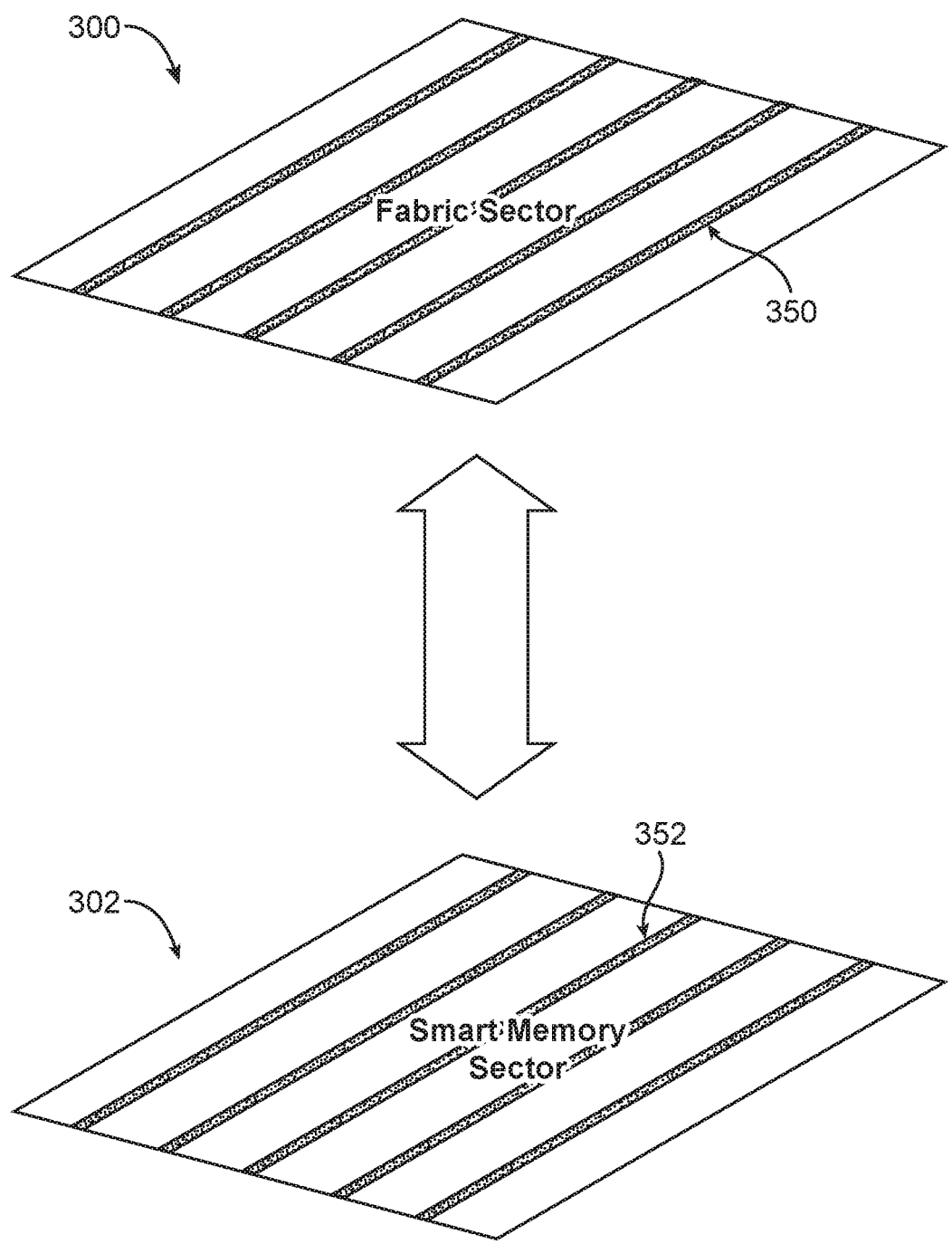
FIG. 3B is a perspective view showing how input-output drivers on a logic fabric sector may be aligned to input-output drivers on a corresponding smart memory sector in accordance with an embodiment.

FIG. 3B illustrates how there may be many distributed connections between each logic fabric sector 300 and the corresponding smart memory sector 302. The connections may be formed using microbump driver/receiver pairs coupled via the microbumps between the top FPGA die and the active interposer. In the example of FIG. 3B, the drivers and receivers may be distributed evenly within each sector or may be grouped together in rows or columns (see, e.g., input-output circuit columns 350 in sector 300 and input-output circuit columns 352 in sector 302). The microbump driver/receiver locations on sectors 300 and 302 may be aligned or may not be aligned, so long as the microbumps themselves are aligned. There may be 2000-4000 connections between each fabric sector 300 and each smart memory sector 302 (as an example). In other suitable embodiments, there may be at least 1000 connections, more than 4000 connections, five hundred to ten thousand connections, or any suitable number of connections linking sector 300 to sector 302. The number of connections may be adjusted as a function of the technology deployed to implement a particular application.

Figure 4:
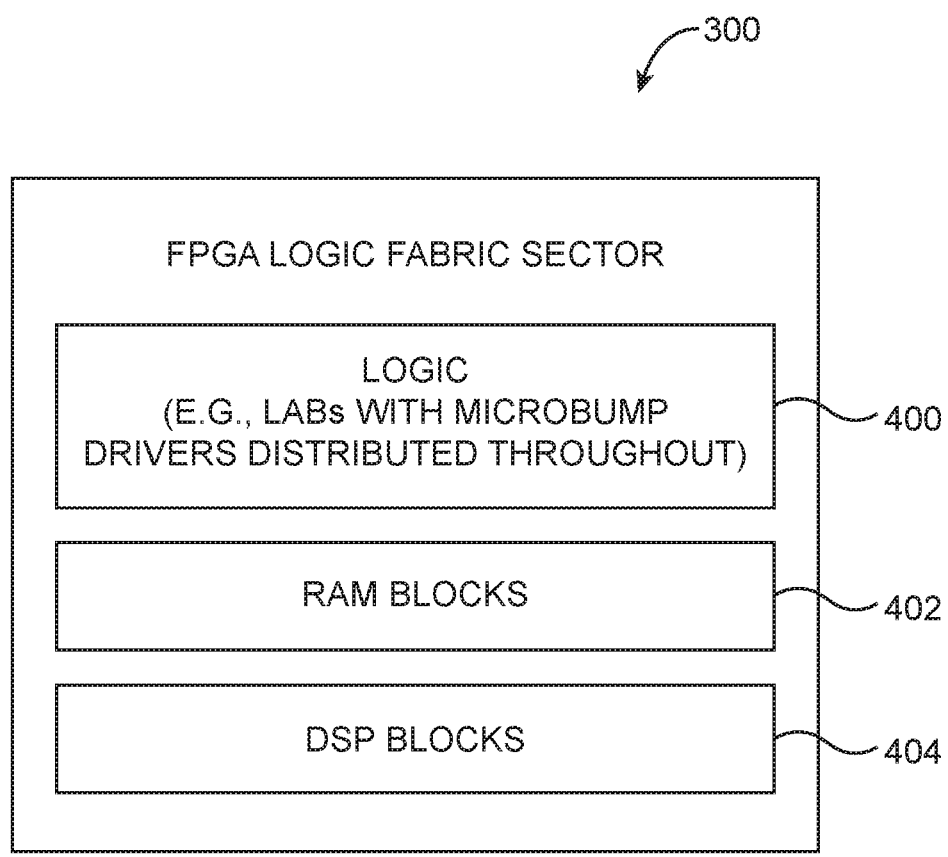
FIG. 4 is a diagram of an illustrative logic fabric sector in accordance with an embodiment.

FIG. 4 is a diagram of an illustrative logic fabric sector 300 in accordance with an embodiment. As shown in FIG. 4, logic fabric sector 300 may include logic circuitry 400 (e.g., logic array blocks with microbump drivers and receivers distributed throughout or lumped into rows or columns), random-access memory (RAM) blocks 402, and DSP blocks 404. RAM blocks 402 may or may not correspond to RAM blocks 130 shown in FIG. 1, whereas DSP blocks 404 may or may not correspond to DSP blocks 120 of FIG. 1. In one suitable arrangement, logic sector 300 may include multiple stripes of DSP blocks 404, multiple stripes of RAM blocks 404, and stripes of logic with microbump drivers distributed among the stripes of DSP and RAM blocks. As described above in connection with FIG. 3, the location of the microbump drivers/receivers is not crucial as long as the micrombumps can be connected to the proper drivers/receiver via on-chip routing. If desired, proper alignment of microbump drivers/receivers can help reduce signal latency and metal use efficiency between driver-receiver pairs.

Figure 5:
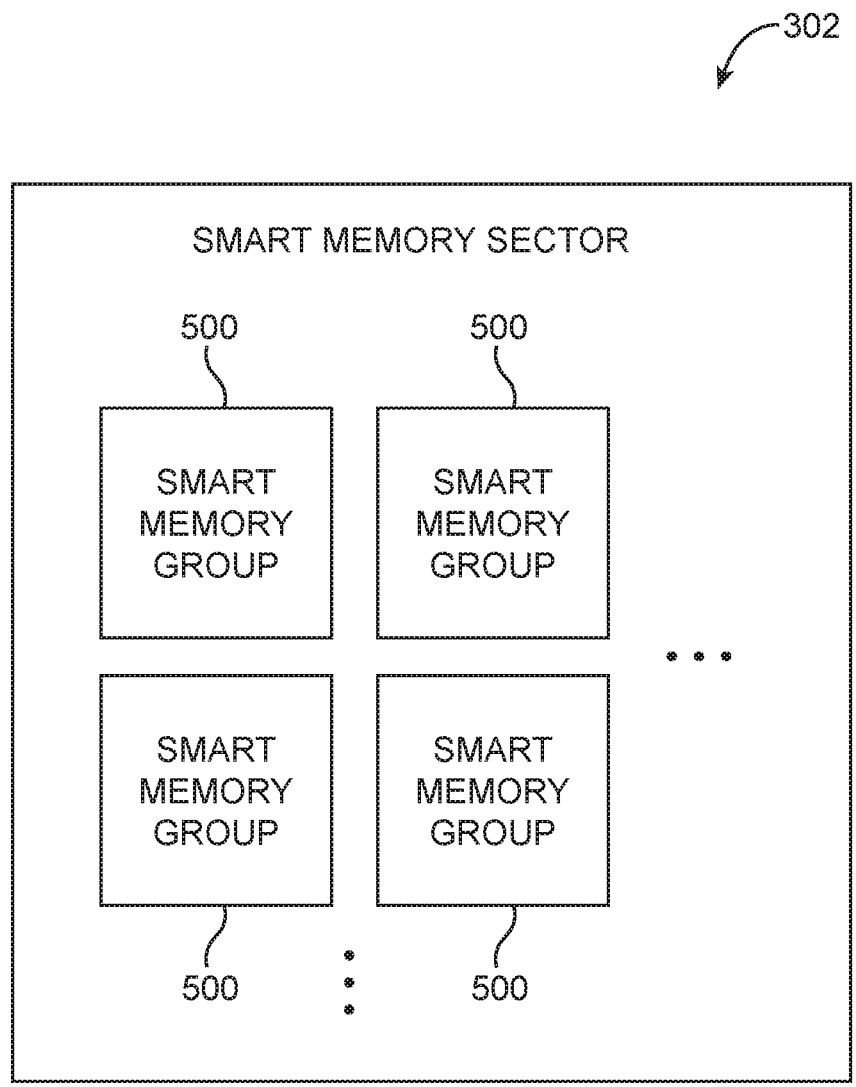
FIG. 5 is a diagram of an illustrative smart memory sector in accordance with an embodiment.
Figure 6:
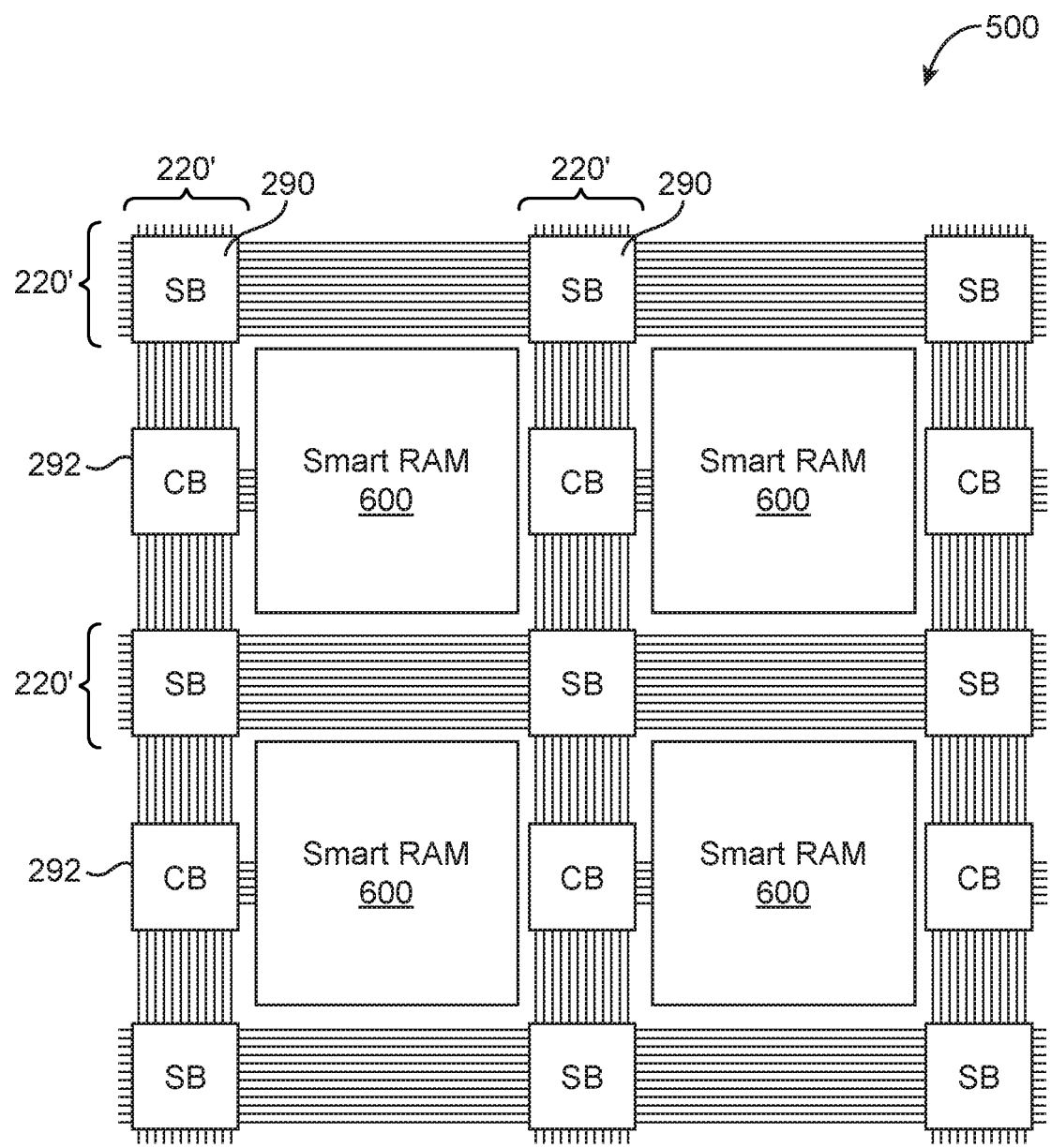
FIG. 6 is a diagram of an illustrative smart memory group in accordance with an embodiment.

FIG. 5 is a diagram of an illustrative smart memory sector 302. As shown in FIG. 5, smart memory sector 302 may include multiple smart memory groups 500. FIG. 6 further illustrates a logical layout, where each smart memory group 500 may include a 4×4 array of smart RAM blocks 600. This configuration is merely illustrative. In general, each smart memory group 500 may include more or less than four smart RAM blocks 600 arranged in a square footprint, a rectangular footprint, or other irregularly shaped footprint.

As shown in FIG. 6, the smart RAM blocks 600 within a smart memory sector may be interconnected using a regular grid of coarse-grain routing paths 220', which are part of the programmable coarse-grain routing network 220 described in connection with FIG. 2. The coarse-grain routing paths 220' may be bundled into groups of wires, which are then switched together using switch boxes (SB) 290 and connection boxes (CB) 292. The switch boxes 290 may be configured to statically route signals throughout the coarse-grain routing network and to optionally pipeline the wire bundles. The connection boxes 292 may serve as local switches to connect the coarse-grain routing network to respect smart RAM blocks 600. Both switch boxes 290 and connection boxes 292 (and also a local group of smart RAM blocks 600) may be statically configured per use model but may also be rapidly and dynamically reconfigured when switching between different use cases.

Figure 7:
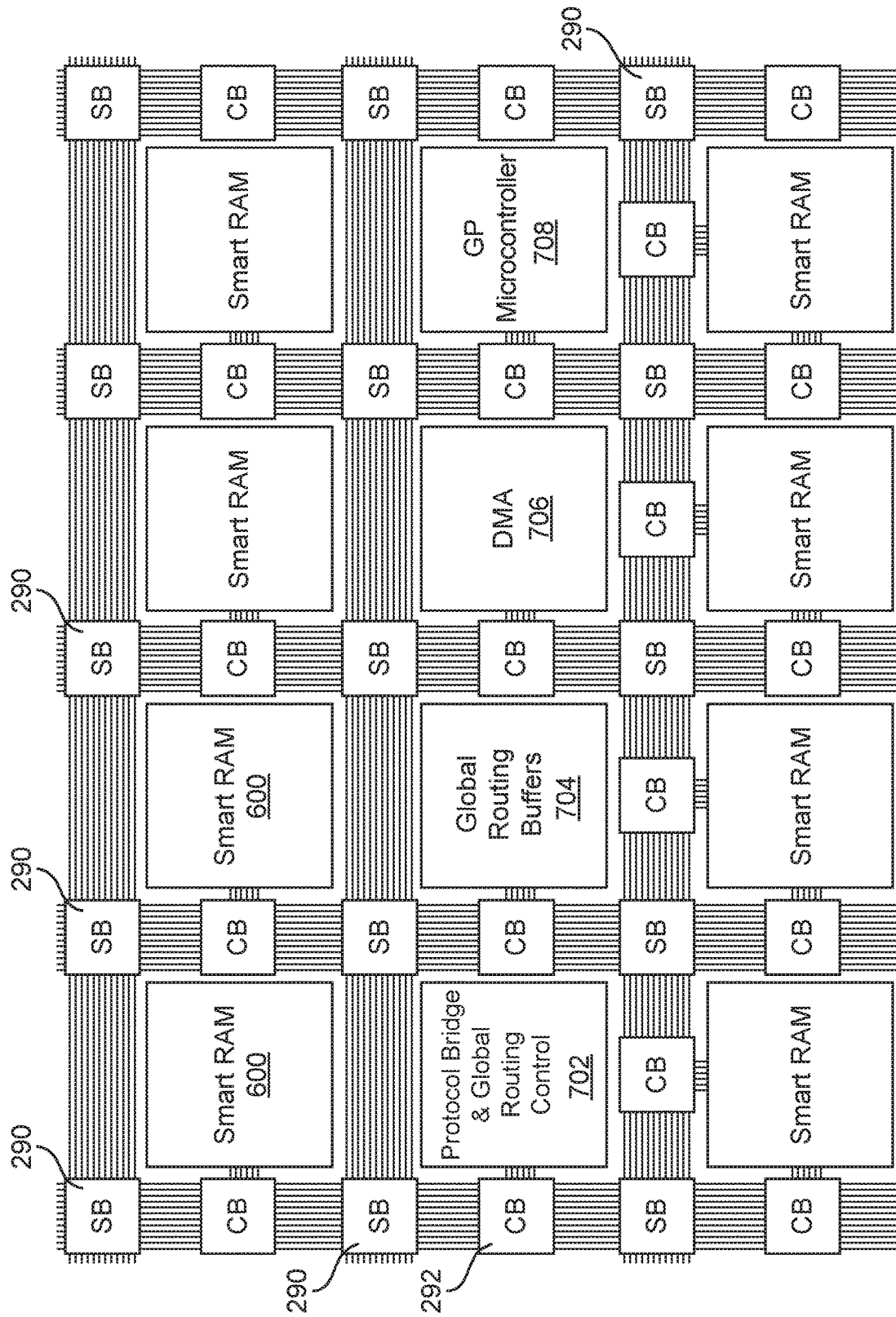
FIG. 7 is a diagram illustrating how specialized functional blocks may be embedded among the array of smart memory blocks in accordance with an embodiment.

FIG. 7 is a diagram logically illustrating how other specialized functional blocks may be embedded among the array of smart memory blocks 600. As shown in FIG. 7, other dedicated function intellectual property (IP) blocks such as blocks 702, 704, 706, and 708 may be inserted in place of smart RAM blocks. These specialized functional blocks may be hardened for enhanced efficiency.

For instance, block 702 may provide protocol bridge and global routing control, whereas block 704 may provide global routing buffers to support a protocol-based network on chip (NoC) overlaid on top of the coarse-grain routing network. Block 706 may be a direct memory access (DMA) controller that generates address and command signals for orchestrating data movement between the various smart RAM blocks. Block 708 may be a general purpose microcontroller operable to handle thermal management functions and/or other more sophisticated/advanced or specialized functions.

If desired, the functions of one or more of hardened IP blocks 702, 704, 706, and 708 may be fully implementable by the smart memory blocks 600 themselves. The exemplary dedicated function IP blocks 702, 704, 706, and 708 of FIG. 7 are merely illustrative and are not intended to the limit the scope of the present embodiments. In general, other types of hardened IP blocks may also be included among the array of smart RAM blocks 600 to provide the desired embedded functionality.

Figure 8:
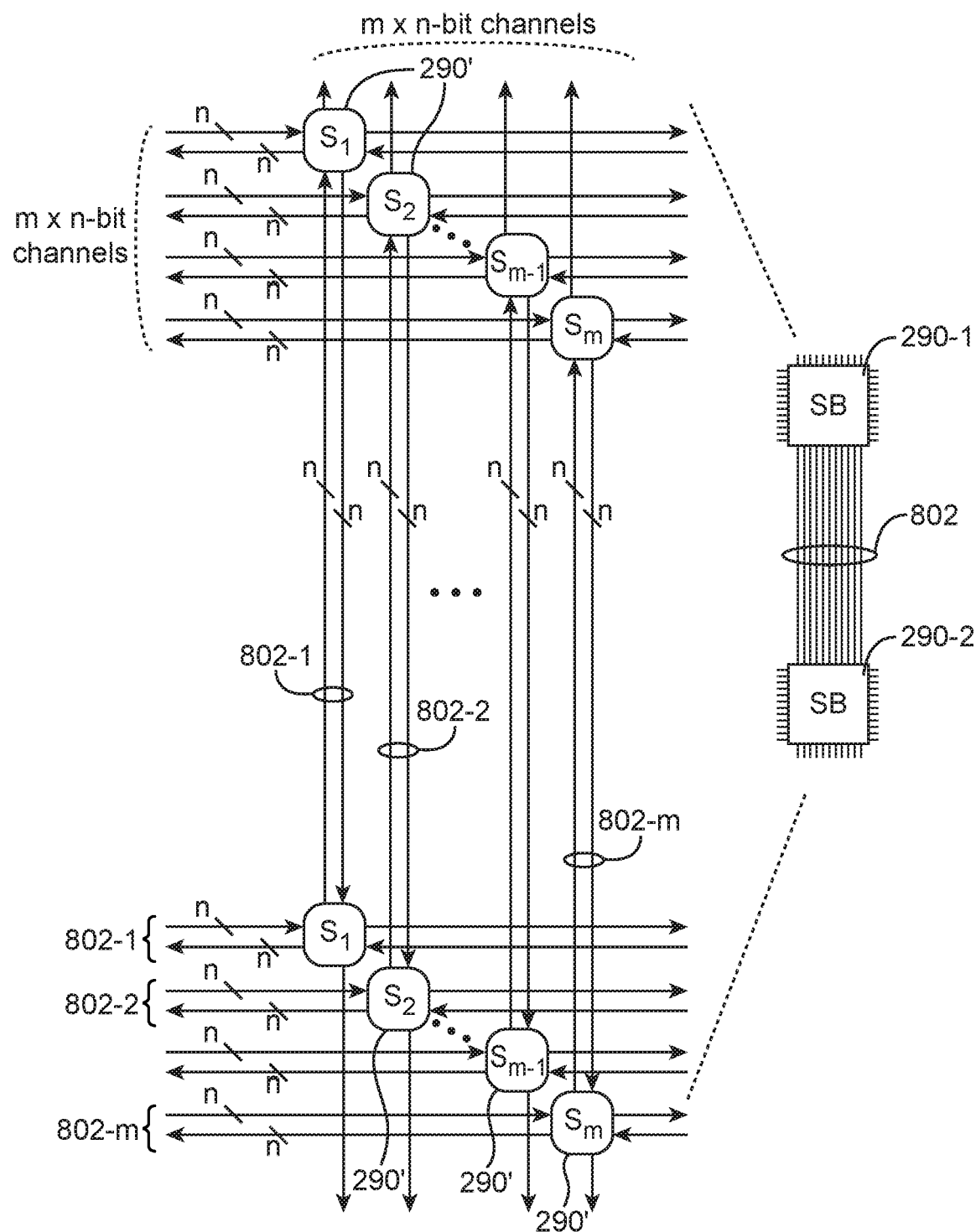
FIG. 8 is a diagram showing how a programmable coarse-grain routing network may be provided with multiple n-bit channels in accordance with an embodiment.

FIG. 8 is a diagram showing how a programmable coarse-grain routing network may be provided with multiple n-bit channels. As shown in FIG. 8, each switch box circuit 290 from FIG. 7 may include multiple instances of m individual switch boxes 290'. Each individual switch box 290' may be coupled to each of four adjacent switch boxes 290' via a set of incoming n-bit bus and outgoing n-bit bus. An example value for the number of channels might be 8 (e.g., m=8), and the width of a channel might be 32 bits (e.g., n=32). This is merely illustrative. The actual values of m and n may be determined and adjusted on a per implementation basis as a function of wire allocation versus smart memory functionality. The coarse-grain routing network may also have multiple different channel widths (e.g., some channels may convey n1 bits, whereas other channels may convey n2 bits, etc.) to accommodate efficient mapping of certain classes of smart memory interface types.

In the example of FIG. 8, a first switch box 290' in switch box circuit 290-1 may be coupled to the first switch box 290' in switch box circuit 290-2 via a first channel 802-1; a second switch box 290' in switch box circuit 290-1 may be coupled to the second switch box 290' in switch box circuit 290-2 via a second channel 802-2; . . . ; and an m-th switch box 290' in switch box circuit 290-1 may be coupled to the m-th switch box 290' in switch box circuit 290-2 via an m-th channel 802-N. Channels are routing both in the horizontal direction (linking switch boxes arranged along the same row) and in the vertical direction (linking switch boxes arranged along the same column).

In some embodiments, channel routing may be granular at a byte level and may be bondable into multiple groups. In one suitable arrangement, the coarse-grain routing interconnects may be divided into four independent groups: (1) a first group of 16 channels, (2) a second group of 8 channels, (3) a third group of 4 channels, and (4) a fourth group of 4 channels. Assuming each channel carries 8 bits in either direction, this configuration provides four independent networks of 16 GBps, 8 GBps, 4 GBps, and 4 GBps, respectively. A different user design might choose a different allocation of channels based on its unique requirements.

In another suitable arrangement, the coarse-grain routing interconnects may be divided into two independent groups: (1) a first group of 16 channels and (2) a second group of 16 channels. This configuration provides two independent networks each providing 15 GBps. In yet another suitable arrangement, the coarse-grain routing interconnects may be divided into three independent groups: (1) a first group of 16 channels, (2) a second group of 12 channels, and (3) a third group of 4 channels. This configuration provides three independent networks of 16 GBps, 12 GBps, and 4 GBps, respectively.

These channel allocations are merely illustrative. In general, m may be any preselected integer and can be divided into any suitable number of groups depending on the needs of the application. This example in which the allocation is selected among 8-bit buses is merely illustrative. If desired, each bus may carry 4 bits (sometimes referred to as a "word"), 2 bits, 2-8 bits, more than 8 bits, 16 bits, 8-16 bits, more than 16 bits, 32 bits, 16-32 bits, more than 32 bits, 64 bits, 32-64 bits, more than 64 bits, or another suitable number of bits.

Figure 9A:
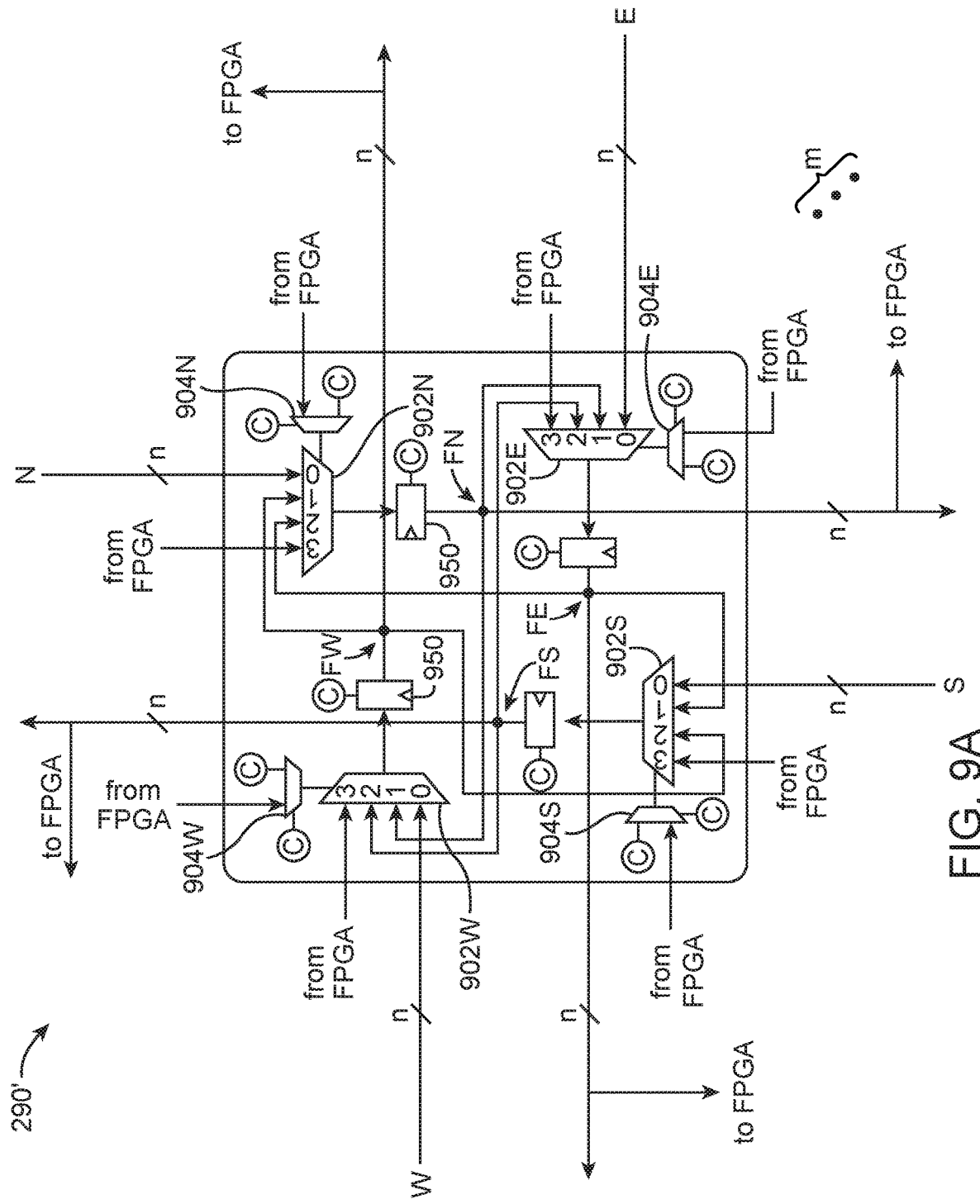
FIG. 9A is a circuit diagram of an illustrative programmable 4-port switch box circuit in accordance with an embodiment.

FIG. 9A is a circuit diagram of an illustrative programmable 4-port switch box circuit 290' in accordance with an embodiment. Each switch box 290' not located at the edge of the coarse-grain routing network 220 may include up to four data path routing multiplexers 902 receiving and sending routing channels in each direction (e.g., north to south, south to north, west to east, and east to west). As shown in FIG. 9A, a first data path routing multiplexer 902W may having a first ("0") input connected a horizontal interconnect from the west (W), a second ("1") input coupled to node FN (i.e., the output of multiplexer 902N), a third ("2") input coupled to node FS (i.e., the output of multiplexer 902S), a fourth input ("3") receiving a signal from the FPGA fabric in the top die, and an output driving node FW. The output of data path routing multiplexer 902W may be latched using a corresponding pipeline register 950. Depending on the distance between adjacent switch boxes 290', pipeline registers 950 may be statically bypassed.

Data path routing multiplexer 902W may be controlled using selector multiplexer 904W. Selector multiplexer 904W may have a first ("0") input configured to receive a static control bit from an associated configuration cell or register embedded locally in the active interposer and a second ("0") input configured to receive a control signal from the FPGA fabric in the top die. The static control bit stored in each configuration cell (c) may be run time configurable. Arranged in this way, data path routing multiplexer 902W may select its "0" input to continue the existing signal routing from the west, select between the two perpendicular directional routing channels (i.e., by picking from either the "1" or "2" input), or select data from the FPGA fabric (i.e., by picking the "3" input).

Each of the four directions may be arranged in a similar fashion, using second data path routing multiplexer 902N to drive node FN from the north, using third data path routing multiplexer 902E to drive node FE from the east, and using fourth data path routing multiplexer 902S to drive node FS from the south. Multiplexer 902N may be controlled by selector multiplexer 904N. Multiplexer 902E may be controlled by selector multiplexer 904E. Multiplexer 902S may be controlled by selector multiplexer 904S. The detailed wiring and connections are shown in FIG. 9A. Connected as such, the FPGA may provide both the data input the each of the data path routing multiplexers 902 as well as the control input for the selector multiplexers 904. this allows the logic fabric in the top die FPGA to act as a dynamic router.

The various multiplexers 902 and 904 in FIG. 9A may be statically configured per use case and can be rapidly updated at run time to enable multiple use cases in a time-domain-multiplexed fashion. For example, the active interposer may be configured in a first mode during first time periods to maximize bandwidth when filling the smart memory blocks with data from off-package double-data-rate (DDR) memory, may be configured in a second mode during second time periods to maximize bandwidth when sorting or rearranging data among the array of smart memory blocks, and may be configured in a third mode during third time periods to maximize the bandwidth when feeding the coarse-grain routing network with control signals from the FPGA logic fabric. Since multiplexers 904 receive inputs from the FPGA fabric, the routing can be dynamically configured using the FGPA logic fabric itself without requiring full device reconfiguration or partial reconfiguration.

The FPGA fabric in the top die and the smart memory circuitry in the active interposer may share a common clock input but this sharing is not required. A common clock signal may allow for a fully deterministic behavior between the smart memory array and the logic fabric array. At power up or system reset, a default connectivity scheme may allow the switch boxes 290' closest to a system controller (e.g., a secure device manager on the FPGA) to be reached given a control address and then switched to reach their neighbors. This process may be iteratively performed to traverse the whole coarse-grain routing network.

Figure 9B:
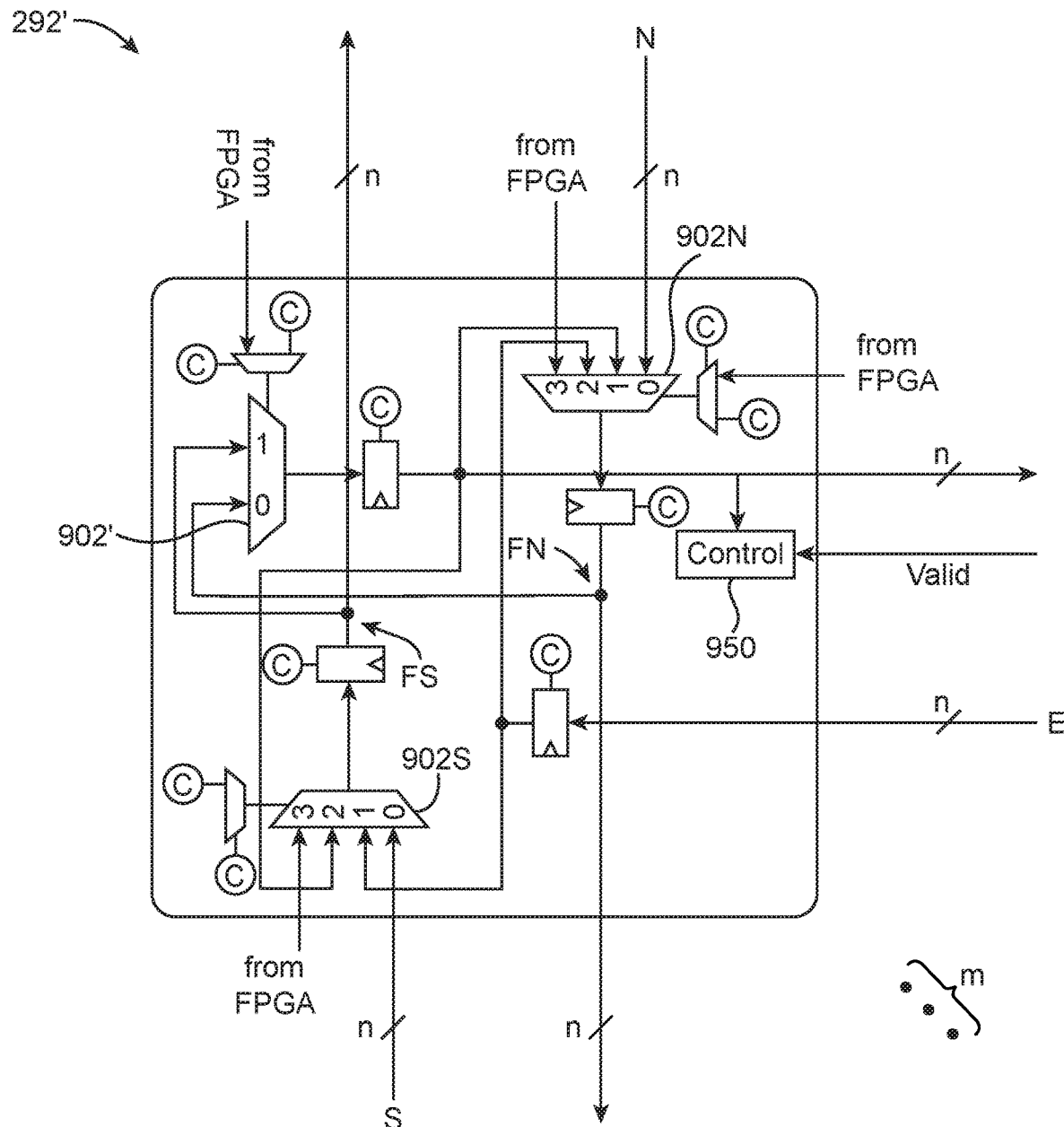
FIG. 9B is a circuit diagram of an illustrative programmable 3-port connection box circuit in accordance with an embodiment.

FIG. 9B is a circuit diagram of an illustrative programmable connection box circuit 292' (see also FIG. 6). Connection box 292' may be a 3-port version of switch box 290', with the option of additional channel multiplexing to allow for more configurability of selecting which coarse-grain network channels are connected to the corresponding smart RAM block 600. In particular, connection box 292 should provide the ability to place the data from the associated smart RAM block 600 onto a coarse-grain routing network channel in response to the local smart RAM block detecting its address. This allows the smart memory to be placed in ranks to create deeper direct access memories.

As shown in FIG. 9B, data path routing multiplexers 902N and 902S are connected in the same way as already described in FIG. 9A. In contrast, however, multiplexer 902' has only a first ("0") data input coupled to node FN (i.e., the output of multiplexer 902N) and a second ("1") data input coupled to node FS (i.e., the output of multiplexer 902S). Connection box 292' is also entirely missing multiplexer 902E in comparison to the switch box 290' of FIG. 9A. The east port of connection box 292' is coupled to an associated smart RAM block. Arranged in this way, the 3-port connection box 292' allows each associated smart RAM block to be coupled to the coarse-grain routing network. Connection box 292' may also include a control circuit 950 that receives a valid signal, which enables the smart RAM block to provide data onto the n-bit channel of the coarse-grain routing network. Operated in this way, different smart RAM blocks will be able to provide data over the same coarse-grain routing wires in different clock cycles.

Figure 10:
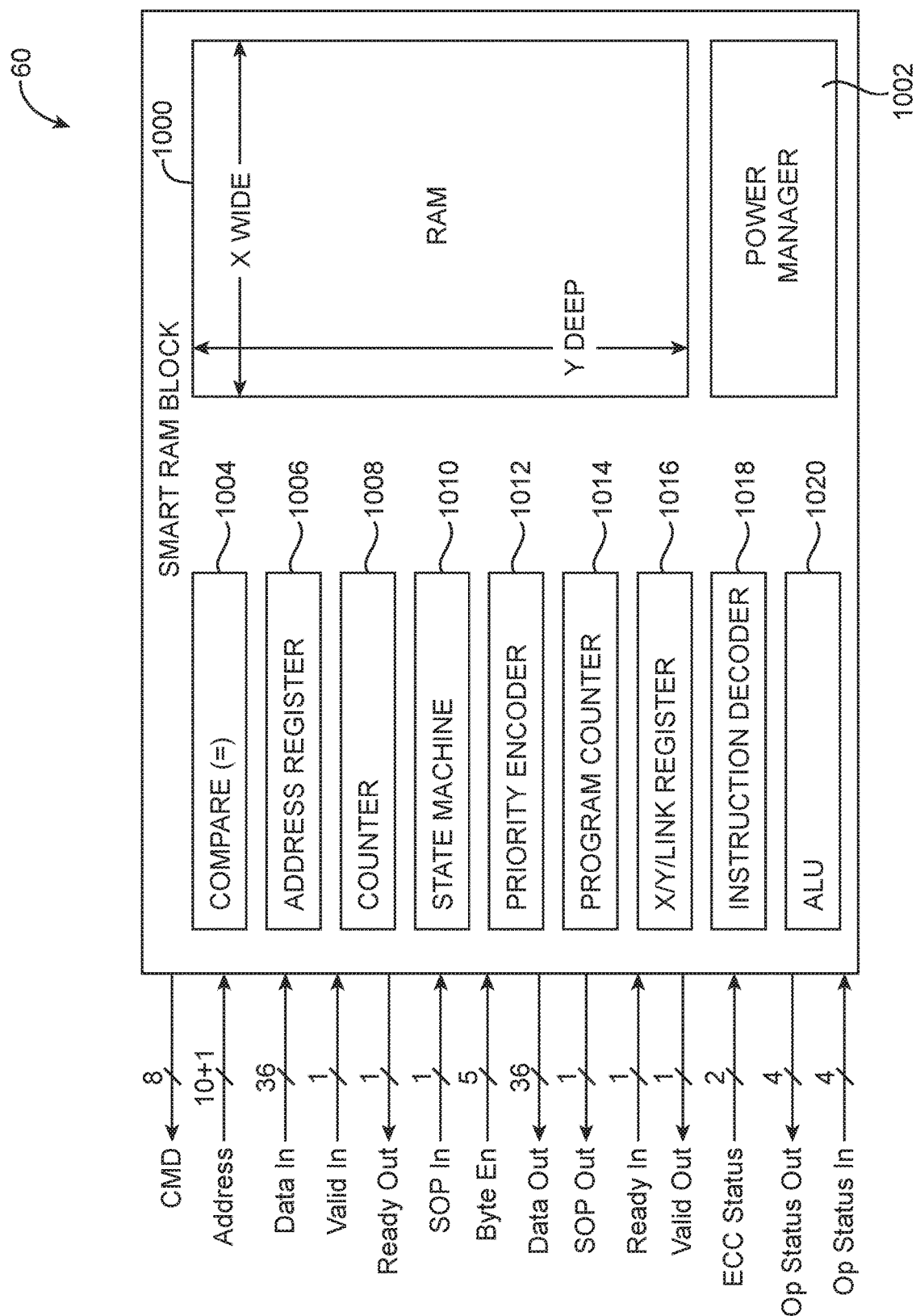
FIG. 10 is a diagram of an illustrative smart memory block in accordance with an embodiment.

FIG. 10 is a diagram of an illustrative smart memory block 600 in accordance with an embodiment. As shown in FIG. 10, smart RAM block 600 may include a X-by-Y RAM array (i.e., a memory array that is X elements wide and Y elements deep), a power management circuit such as power manager 1002, a comparison circuit such as comparator 1004, an addressing circuit such as address register 1006, a counting circuit such as counter 1008, a state machine circuit such as state machine 1010, a priority encoding circuit such as priority encoder 1012, a program counter 1014, a register such as X/Y/link register 1016, an instruction decoder 1018, and arithmetic logic unit (ALU) 1020.

RAM array 1000 may, for example, be a standard single-port random-access memory with address, data-in, data-out, write enable, and byte enable terminals. RAM 1000 can exhibit a word width that is selectively sized to match either the coarse-grain routing (CGR) network channel size or an integer multiple of the CGR channel size. RAM array 1000 may also support error-correcting code (ECC) that can detect and correct various kinds of internal data corruption. If desired, RAM array 1000 may be a dual-port or multiport memory with additional memory control capabilities.

Power manager 1002 may be configured to manage the power state of the smart RAM block 600. For example, power management circuit 1002 may statically or dynamically power down a smart RAM block 600 if it is unused for a configurable period of time. Powering down one or more smart RAM blocks 600 can help reduce power consumption at the cost of increased latency.

Address register 1006 may be configured to store the address of a smart RAM block 600. This allows each smart RAM block to respond in response to determining that its address is asserted on the input address line. The value stored in address register 1006 may therefore sometimes be referred to as "my address." Operated in this way, one or more smart RAM blocks may be used to support various data widths and depth at configuration time (e.g., a smart RAM block may be divided into multiple smaller memory sub-blocks or multiple smart RAM blocks may be composable into a larger memory block). Comparison circuit 1004 (sometimes referred to as an equals module) may be used to compare the stored "my address" register value to the value provided on the address input. Priority encoder 1012 may be used to support content addressable memory (CAM) operations to extract address values for matching data words.

Counter 1008 may be configured to support programmable burst lengths in response to commands requiring a streaming response. State machine 1010 may be configured to sequence command responses. Having an embedded state machine 1010 allows smart RAM block 600 to perform low-cycle-count operations without execution of a program code that is typically required for a microcontroller.

In addition to operating as a command-based state machine, smart RAM block 600 may further be configured as a microcontroller to perform more complex multicycle operations with higher cycle count than the state machine driven operations. In the example of FIG. 10, smart RAM block 600 includes microcontroller circuitry 1050 having a program counter 1014, a X/Y/link register 1016, an instruction decoder 1018, and ALU 1020.

Program counter 1014 may be used to provide an address/location of the instruction currently being executed. Instruction decoder 1018 may be configured to interpret an instruction and to set corresponding tasks associated with that instruction into motion. ALU 1020 may be a digital circuit configured to perform arithmetic and logic operations. Register 1016 may represent one or more registers that are used by the state machine or the microcontroller to hold operations for the ALU, return values for a jump command, etc.

Still referring to FIG. 10, smart RAM block 600 may be configured to receive and output a plurality of interface signals. For example, smart RAM block 600 may be provided with a command (CMD) input port (e.g., an 8-bit input terminal) that receives commands. The received commands may be interpreted by state machine 1010 or by the microcontroller circuitry 1050 to implement one or more use cases described below in connection with FIG. 11. Block 600 may have an address input port (e.g., an 11-bit input terminal) that is used to detect whether the received address signal is equal to "my address" stored in the local address register 1006.

Smart RAM block 600 may also include a data input port configured to receive write data or other input data for comparison operations. In the example of FIG. 10, the data input port is configured to receive 36 bits of data. This is merely illustrative. In general, the smart RAM block data input port may be configured to receive 4-bit wide data, 8-bit wide data, 16-bit wide data, 2 to 36 bits of data, 32 to 64 bits of data, more than 64 bits of data, or data of any suitable bit width. Data output or read from the smart memory RAM array 1000 may be provided on the data output port. The data output port may be the same or different bit width than the data input port.

Smart RAM block 600 may have a valid input port configured to receive a valid signal indicating whether signals at the data input port and/or other input terminals are valid. Smart RAM block 600 may also have a valid output port configured to generate a valid signal indicating whether the smart memory block is presenting valid information at its data output port and/or other output terminals. The ready input port is configured to receive a signal that indicates whether a corresponding destination smart memory block is able to accept data, whereas the ready output port is configured to output a signal that indicates whether that smart RAM block is able to accept data inputs.

Smart RAM block 600 may further include a start of packet (SOP) input port configured to receive a signal that indicates the start of a streaming transfer of information and also a SOP output port on which a signal is asserted when that smart memory block is beginning a packet transfer. The byte enable input port may receive bits that are used to selectively write or mask bits arriving at the data input port.

The error correction code (ECC) status output port may be used to indicate the status of RAM ECC events (e.g., when one or more erroneous bits have been detected and/or corrected). The operation (op) status input port may be used to indicate when that smart RAM block is communicating with another smart RAM block via the coarse-grain routing network. Moreover, the operation status input may be used for synchronization as well as extending ALU operations across multiple smart RAM blocks (e.g., extending carry, match, priority encoding, and other suitable operations across a targeted number of smart memory blocks). Conversely, the operation (op) status output port may be used to indicate the status of the last operation, which may or may not include signals for informing the associated control box that this particular smart RAM block should be multiplexed onto the coarse-grain routing network.

The various interface signals described above with respect to smart RAM block 600 are merely illustrative and are not intended to limit the scope of the present embodiments. If desired, smart RAM block 600 may include fewer input ports, fewer output ports, more input ports, more output ports, and/or other suitable input-output ports capable of implementing the desired functions of state machine 1010 and microcontroller circuitry 1050.

Figure 11:
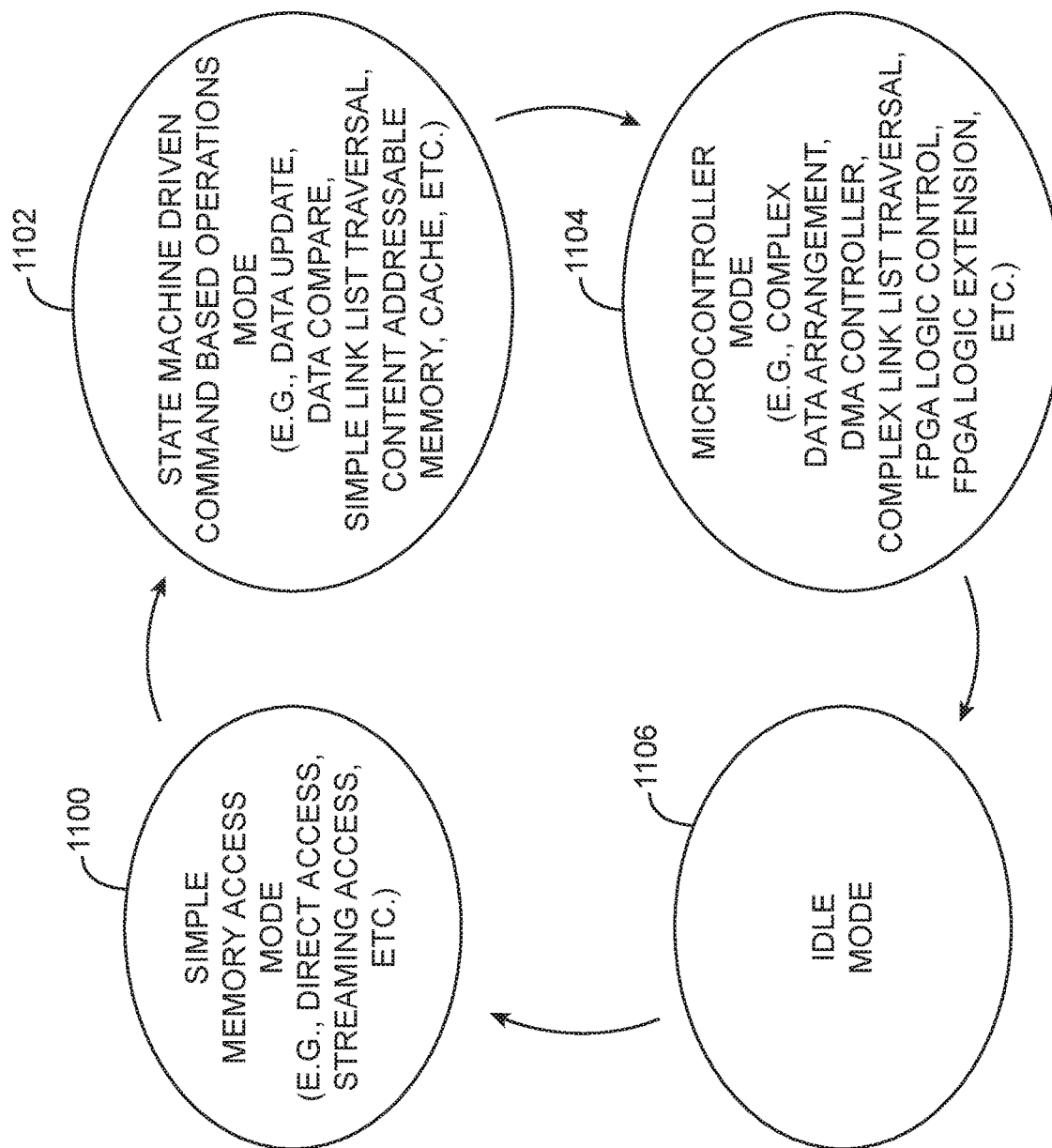
FIG. 11 is a diagram illustrating various modes that can be supported by the smart memory block of FIG. 10 in accordance with an embodiment.

FIG. 11 is a diagram illustrating a plurality of different memory operation types that can be supported by smart RAM block 600 of the type shown in FIG. 10. As shown in FIG. 11, smart RAM block 600 may be operable in at least four modes: (i) simple memory access mode 1100, (ii) state machine driven command based operations mode 1102, (iii) microcontroller mode 1104, and (iv) idle mode 1106. These modes are merely illustrative. If desired, smart RAM block 600 may be configured to support all of these modes, any subset of these modes, or other suitable modes not typically supported by conventional RAM blocks or a generic microcontroller.

In simple memory access mode 1100, the smart RAM block may be configured to perform direct memory access and streaming memory access. During direct memory access operations, the RAM's native protocol may be used to perform normal read and write operations (i.e., one read or one write access per memory cycle). This can be accomplished by configuring and connecting multiple smart RAM blocks 600 with the coarse-grain routing network to the required source and destination and by setting the respective "my address" fields appropriately. If desired, a smart RAM block 600 may be configured to broadcast to multiple target smart RAM blocks to allow for variable data width or memory depth. For different memory depths, each smart RAM block with a particular rank may be configured to respond to an offset address as a function of the depth of each smart RAM block in that rank and to provide an op status output to its associated 3-port connection box to insert its results into the coarse-grain routing network channel.

During streaming access operations, bursts of data may be streamed to and from a given smart RAM block. As an example, 256 bytes of data may be streamed per memory cycle. This can be accomplished by using the command (CMD) interface to request a burst read or write. Similar to direct access, data widths can be varied and bursts longer than one RAM depth can be executed via op status input-output handshake connection with the coarse-grain routing network. The source of the command and the source/destination of the data may be set by the configuration of the coarse-grain routing network or by another smart RAM block, from the top-die FPGA logic fabric, or from some other dedicated functional IP block (see FIG. 7). Data movement between the source and destination can be managed using the SOP, ready, and valid input/output signals. Moreover, the op status input/output signals may be used to synchronize multiple smart memory blocks.

In the state machine driven mode 1102, smart RAM block 600 may be configured to perform data update in memory, data compare in memory, simple linked list traversal, content addressable memory (CAM) operations, memory cache operations, etc. The use of an embedded state machine (e.g., state machine 1010 in FIG. 10) enables the smart memory block to perform these low-cycle-count operations without executing a microcontroller program code.

During a data update operation, a value held in the smart RAM block may be updated (e.g., once per two memory cycles). Example operations that can be performed during a data update include add, subtract, other simple arithmetic operations, logic AND, logic OR, logic NAND, logic NOR, logic XOR, logic XNOR, other simple logic functions, and/or other suitable low cycle operations. The destination and width of the data being updated may be set by the value stored in the "my address" register. Any carry-in data from a neighboring smart RAM block or any carry-out data to a neighboring smart RAM block may be performed by issuing appropriate control signals at the op status input-output ports.

During a data compare operation, a value held in the smart RAM block may be compared with a provided value to determine whether there is a match. Example operations that can be performed during a data compare include a straightforward compare or mask and compare. The value to be compared may be provided at the data input port. The smart RAM block may include an additional register for storing the masking bits. Any carry-in data from a neighboring smart RAM block or any carry-out data to a neighboring smart RAM block may be performed by issuing appropriate control signals at the op status input-output ports, where results of the comparison may be provided at the op status output and routed to the desired endpoint via the coarse-grain routing network (as an example).

The state machine may also be configured to perform a simple linked list traversal by looking up predefined control and next address fields, where the linked list being traversed may be entirely contained within a single smart RAM block or may span multiple smart RAM blocks. More complex linked list traversals (e.g., coded traversals) may be supported only during the microcontroller mode 1104.

The state machine may also be configured to as content addressable memory (CAM), where the data match value becomes the address to the RAM array and the comparison logic 1004 (FIG. 10) determines whether the value is found and identifies the bit position where it was found using priority encoder 1012. The CAM may be configured in either linear mode or hierarchical mode (as examples). In the linear mode, multiple smart RAM blocks can be combined together either to increase the CAM word size or extend the bit size. In the hierarchical mode, the CAM outputs from one smart RAM block or a group of smart RAM blocks can be fed into another smart RAM block or another group of smart RAM blocks to create a hierarchical CAM. If desired, the data widths and RAM depth may be varied.

The smart RAM state machine may further be configured as cache memory, where the top-die FPGA is the source of the cache lookup. This may be accomplished by configuring multiple smart memory blocks and the coarse-grain routing network such that results from smart memory blocks operating as tag RAM (e.g., RAM used to hold addressed) to smart memory blocks operating as data RAM. The tag RAM may use the internal compare function to determine if the required data is current stored in their local RAM array. If there is a match in data, the associated data may be returned with the rest of the tag fields to the FPGA fabric.

The various state machine driven operations described above are merely illustrative and are not intended to limit the scope of the present embodiments. If desired, other low cycle operations that are not typically supported by a generic microcontroller and that do not require the execution of a program code may be supported during mode 1102. For example, one or more smart RAM blocks may be stitched with the coarse-grain routing network to enable configurable memory width and depth when supporting the command based state machine operations. As another example, one or more smart RAM blocks may be stitched with the coarse-grain routing network to allow some subset of the smart memory to be configured and integrated with the FPGA fabric to perform unique non-generic microcontroller functions.

In the microcontroller mode 1104, smart RAM block 600 may be configured to perform complex data (re)arrangement, direct memory access (DMA) controller functions, complex linked list traversal (relative to the "simple" linked list traversal described above in connection with mode 1102), FPGA logic control, FPGA logic extension, etc.

In a first microcontroller mode, the smart RAM block may serve as a DMA controller to rearrange data in the RAM array to enable efficient access by the FPGA logic or efficient access to paged memory in an off-package memory such as DDR memory (e.g., data may be moved within a smart RAM block, across different smart RAM blocks, to and from a dedicated hard IP block within an array of smart RAM blocks, to and from external DDR memory, to and from the top-die FPGA logic, etc.). Exemplary memory access include X/Y array swapping, striding fields, extracting fields, sorting fields, inserting fields, collapsing fields, etc. These operations may be accomplished by using the microcontroller circuitry on the smart RAM block to generate addresses or using the FPGA logic to generate addresses for a given smart RAM block, where the coarse-grain routing network channels are used to convey data from a source smart RAM block to a destination smart RAM block.

In a second microcontroller mode, the smart RAM block may be configured to perform complex linked list traversal. In this mode, the microcontroller circuitry within the smart RAM block may be used to execute more advanced linked list traversal such as coded traversals. In another microcontroller mode, the microcontroller circuitry within the smart RAM block may be used to generate control words for the FGPA logic fabric. In yet another microcontroller mode, the smart RAM block may be extended by the FPGA logic. For example, the FPGA logic fabric may couple custom instructions to one or more smart RAM blocks.

The various microcontroller operations described above are merely illustrative and are not intended to limit the scope of the present embodiments. These microcontroller functions may be secondary relative to the smart RAM block's optimization around its use in other modes as a composable RAM and or the state machine driven functions of mode 1102. A generic microcontroller would not be able to support the smart RAM functions described in connection with simple mode 1100 and state machine driven mode 1102.

Still referring to FIG. 11, the smart RAM block may also be configured in idle mode 1106. Local or short distance routing may be dominated by FGPA to FPGA routing, whereas global or long distance routing may be handled by smart RAM to smart RAM routing, smart RAM to peripheral routing, or network on chip routing. In the idle mode, the smart memory is prevented from performing useful work due to lack of routability in this mode.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

EXAMPLES

The following examples pertain to further embodiments.

Example 1 is a multichip package, comprising: a package substrate; an active interposer mounted on the package substrate; and an integrated circuit mounted on the active interposer, wherein the active interposer comprises: a programmable coarse-grain routing network having a plurality of channels forming a deterministic routing path with guaranteed timing closure; and smart memory circuitry configured to perform a plurality of different memory operation types that include higher level functions than simple read and write memory access.

Example 2 is the multichip package of example 1, wherein the smart memory circuitry optionally comprises a state machine configured to perform a sequence of command based operations without execution of a program code.

Example 3 is the multichip package of example 2, wherein the smart memory circuitry optionally comprises microcontroller circuitry configured to perform more complex operations than the command based operations associated with the state machine.

Example 4 is the multichip package of any one of examples 2-3, wherein the command based operations performed by the state machine optionally comprise operations selected from the group consisting of: a data update, a data comparison, and a linked list traversal.

Example 5 is the multichip package of any one of examples 2-4, wherein smart memory circuitry is optionally implemented as content addressable memory (CAM) using the state machine.

Example 6 is the multichip package of any one of examples 2-5, wherein smart memory circuitry is optionally implemented as cache memory using the state machine.

Example 7 is the multichip package of example 3, wherein the complex operations performed by the smart memory circuitry optionally comprise operations selected from the group consisting of: a data arrangement and a linked list traversal.

Example 8 is the multichip package of any one of examples 3 and 7, wherein smart memory circuitry is optionally implemented as a direct memory access (DMA) controller using the microcontroller circuitry.

Example 9 is the multichip package of any one of examples 3, 7, and 8, wherein the integrated circuit die optionally comprises logic fabric circuitry, and wherein the microcontroller circuitry is optionally configured to generate control signals for the logic fabric circuitry on the integrated circuit die.

Example 10 is the multichip package of any one of examples 1-9, wherein the smart memory circuitry optionally comprises a plurality of random-access memory (RAM) blocks that can be composed into memory of variable width and depth.

Example 11 is the multichip package of any one of examples 1-10, wherein the integrated circuit die optionally comprises an array of logic fabric sectors, and wherein the smart memory circuitry optionally comprises an array of smart memory sectors spatially corresponding to the array of logic fabric sectors.

Example 12 is the multichip package of example 11, wherein the array of logic fabric sectors optionally comprises a first group of input-output driver circuits, and wherein the array of smart memory sectors optionally comprises a second group of input-output driver circuits aligned to the first group of input-output driver circuits.

Example 13 is the multichip package of any one of examples 11-12, wherein each smart memory sector in the array of smart memory sectors optionally comprises a plurality of smart random-access memory (RAM) blocks interconnected by the programmable coarse-grain routing network.

Example 14 is the multichip package of example 13, wherein the smart RAM blocks optionally are interconnected using an array of configurable 4-port connection box circuits.

Example 15 is the multichip package of example 14, wherein the smart RAM blocks are optionally connected to the programmable coarse-grain routing network via a plurality of configurable 3-port switch box circuits.

Example 16 is the multichip package of any one of examples 13-15, wherein the active interposer optionally further comprises at least one dedicated function intellectual property (IP) block embedded within plurality of smart RAM blocks.

Example 17 is the multichip package of example 16, wherein the dedicated function IP block optionally comprises a hardened block selected from the group consisting of: a protocol bridge and global routing control block, a global routing buffer block, a direct memory access block, and a microcontroller.

Example 18 is circuitry, comprising: a plurality of programmable logic fabric sectors; and a plurality of smart memory sectors formed directly under the plurality of programmable logic fabric sectors, wherein each smart memory sector in the plurality of smart memory sectors comprises an array of smart random-access memory (RAM) blocks, and at least one smart RAM block in the array of smart RAM blocks comprises: a state machine configured to perform operations at a first speed; and microcontroller circuitry configured to perform operations at a second feed slower than the first speed.

Example 19 is the circuitry of example 18, wherein the microcontroller circuitry optionally comprises a program counter, a link register, an instruction decoder, and an arithmetic logic unit.

Example 20 is the circuitry of any one of examples 18-19, wherein the at least one smart RAM block optionally further comprises: an address register configured to store a local address; an address input configured to receive an address signal; and a comparison circuit configured to compare The value of the address signal to the stored local address.

Example 21 is the circuitry of any one of examples 18-20, wherein the at least one smart RAM block optionally further comprises a counter configured to support programmable burst lengths in response to commands requiring a streaming response.

Example 22 is the circuitry of any one of examples 18-21, wherein the at least one smart RAM block optionally further comprises a priority encoder 1012 configured to support content addressable memory (CAM) operations to extract address values for matching data words.

Example 23 is the circuitry of any one of examples 18-22, wherein the at least one smart RAM block optionally further comprises a power manager configured to manage the power state of the at least one smart RAM block.

Example 24 an apparatus, comprising: an active interposer; and a field-programmable gate array (FPGA) die mounted on the active interposer, wherein the active interposer comprises: smart memory circuitry comprises random-access memory (RAM) blocks composable into different widths and depths and a state machine configured to drive a sequence of operations without having to execute a microcontroller program code.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An active interposer comprising:
   a programmable coarse-grain routing network having channels forming a deterministic routing path; and
   an array of memory blocks accessible using the programmable coarse-grain routing network, wherein at least one memory block in the array of memory blocks is operable in a state-machine-driven mode to perform a sequence of operations, and wherein the at least one memory block is operable in a microcontroller mode to perform multicycle operations with a higher cycle count than the operations performed during the state-machine-driven mode.

2. The active interposer of claim 1, wherein the sequence of operations comprises operations selected from the group consisting of: a data update, a data comparison, and a linked list traversal.

3. The active interposer of claim 1, wherein the at least one memory block is operable as content addressable memory (CAM) in the state-machine-driven mode.

4. The active interposer of claim 1, wherein the at least one memory block is operable as cache memory in the state-machine-driven mode.

5. The active interposer of claim 1, wherein the at least one memory block is further operable in a simple memory access mode to perform operations selected from the group consisting of: a direct memory access and a streaming memory access.

6. The active interposer of claim 1, wherein the multicycle operations comprise operations selected from the group consisting of: data arrangement operations, direct memory access controller operations, linked list traversal operations, programmable logic control operations, and memory expansion operations.

7. The active interposer of claim 1, wherein the array of memory blocks are composable into different sizes.

8. The active interposer of claim 1, wherein the at least one memory block is further operable in an idle mode.

9. An active interposer, comprising:
   a programmable coarse-grain routing network having channels forming a deterministic routing path operable to communicatively couple to programmable logic disposed in a different spatial plane relative to the programmable coarse-grain routing network;
   an array of memory blocks accessible using the programmable coarse-grain routing network; and
   at least one functional block that is formed within the array of memory blocks, that is accessible using the programmable coarse-grain routing network, and that is configured to perform a different function than the array of memory blocks.

10. The active interposer of claim 9, wherein the at least one function block comprises a hardened block selected from the group consisting of: a protocol bridge and global routing control block, a global routing buffer block, a direct memory access block, and a microcontroller.

11. The active interposer of claim 9, wherein the at least one functional block is implemented using a memory block.

12. The active interposer of claim 9, wherein the programmable coarse-grain routing network comprises an array of configurable 4-port switch box circuits.

13. The active interposer of claim 12, wherein the programmable coarse-grain routing network further comprises configurable 3-port connection box circuits that are used to directly access the array of memory blocks and the at least one functional block.

14. An active interposer comprising:
a memory block that comprises:
   a state machine that is active during a first mode to perform operations having a first cycle count; and
   a program counter that is active during a second mode to perform operations having a second cycle counter that is higher than the first cycle count.

15. The active interposer of claim 14, wherein the memory block further comprises a power management circuit configured to manage a power state of the memory block.

16. The active interposer of claim 14, wherein the memory block further comprises a counter configured to support programmable burst lengths.

17. The active interposer of claim 14, wherein the memory block further comprises a start of packet (SOP) input port and a start of packet (SOP) output port.

18. The active interposer of claim 14, wherein the memory block further comprises:
   a data input port; and
   a valid input port configured to receive a valid signal indicating whether signals at the data input port are valid.

19. The active interposer of claim 14, wherein the memory block is further operable to perform error-correcting code (ECC) operations.

20. The active interposer of claim 14, comprising a programmable coarse-grain routing network having channels forming a deterministic routing path operable to communicatively couple between the memory block and programmable logic disposed in a different spatial plane relative to the memory block.

* * * * *